United States Patent [19]

Yoshida et al.

[11] Patent Number: 4,662,985
[45] Date of Patent: May 5, 1987

[54] METHOD OF SMOOTHING OUT AN IRREGULAR SURFACE OF AN ELECTRONIC DEVICE

[75] Inventors: Satoshi Yoshida; Joe Ueoka; Yoshiaki Katou, all of Kanagawa, Japan

[73] Assignee: Fuji Photo Film Co., Ltd., Kanagawa, Japan

[21] Appl. No.: 843,416

[22] Filed: Mar. 24, 1986

[30] Foreign Application Priority Data

Mar. 27, 1985 [JP] Japan .................................. 60-62500
Mar. 29, 1985 [JP] Japan .................................. 60-66211

[51] Int. Cl.$^4$ ...................... B44C 1/22; H01L 21/306
[52] U.S. Cl. .................................... 156/643; 156/648;
156/651; 156/657; 156/668; 156/661.1
[58] Field of Search ............... 156/643, 648, 650, 651,
156/657, 666.1, 668

[56] References Cited

U.S. PATENT DOCUMENTS 4,444,616  4/1984  Fujita ........................... 156/643 X
4,460,434  7/1984  Johnson et al. ..................... 156/643
4,514,479  4/1985  Ferrante ......................... 156/643 X Primary Examiner—Robert Lindsay
Attorney, Agent, or Firm—Sughrue, Mion, Zinn, Macpeak & Seas

[57] ABSTRACT

An photoresist deposited by sputtering or evaporation on an insulation layer to be smoothed out is etched by an ion beam applied at a first angle of ion bombardment which is smaller than an angle of ion bombardment at which the photoresist can be etched at a maximum etching rate. Thereafter, the photoresist and the insulation layer are etched at a second angle of ion bombardment at which the photoresist and the insulation layer are etched at the same rate. The first angle is larger than 30° and smaller than 45°, and the second angle is 75°.

4 Claims, 15 Drawing Figures

METHOD OF SMOOTHING OUT AN IRREGULAR SURFACE OF AN ELECTRONIC DEVICE

BACKGROUND OF THE INVENTION

1. Field of the Invention

The present invention relates to a method of flattening or smoothing out an irregular surface of an insulation layer by ion etching in the fabrication of an electronic device such as a thin-film magnetic head, a semiconductor device, or the like.

2. Description of the Prior Art

Thin-film magnetic heads of a laminated structure include a substrate, a lower magnetic layer deposited on the substrate, a first insulation layer deposited on the lower magnetic layer, a single or a plurality of coil conductor layers deposited on the first insulation layer, a second insulation layer deposited on the coil conductor layer(s), and an upper magnetic layer deposited on the second insulation layer. The second insulation layer, made of $SiO_2$ for example, is deposited by sputtering or evaporation on the coil conductor layer(s) before the upper magnetic layer is deposited thereon. The second insulation layer thus deposited however has surface irregularities because the coil conductor layer(s) underneath the second insulation layer has surface irregularities. Therefore, a magnetic material such as Sendust or an amorphous material, if directly deposited as the upper magnetic layer on the second insulation layer by sputtering or evaporation would also have corresponding surface irregularities and hence would be subject to a reduction in magnetic permeability, with the result that the recording and reproducing efficiency of the produced magnetic head would be reduced. To eliminate the above drawbacks, the uneven surface of the second insulation layer is normally flattened or smoothed out.

In one conventional process of smoothing out surface irregularities, a photoresist is coated on an insulation layer of $SiO_2$ having surface irregularities to a thickness of about 8 micrometers, thereby smoothing out the surface irregularities of the insulation layer. Then, the photoresist is heated to at least 130° C. to improve the surface flatness thereof. Thereafter, the photoresist and the insulation layer are etched by an ion beam applied at such an angle that they can be etched at the same etching rate, the angle being referred to as an angle of ion bombardment formed between the ion beam and a line normal to the surface being etched. Such an ion etching process is known as ion milling or ion machining. After the insulation layer has been smoothed out, an upper magnetic layer of Sendust or an amorphous material is sputtered or evaporated as an upper magnetic pole on the insulation layer. Since the upper magnetic layer on the flat insulation layer is substantially free of surface irregularities, its magnetic permeability is not lowered and the resultant thin-film magnetic head has an improved recording and reproducing efficiency.

However, the above prior flattening process has the following difficulties: Where the ion milling is carried out using an inert gas such as Ar, the angle of ion bombardment at which the photoresist and the insulation layer can be etched at the same rate is about 75° which is larger than the angle of ion bombardment (about 55°) at which the photoresist can be etched at a maximum etching rate. When the photoresist is etched at such a large angle of ion bombardment, the etched photoresist material tends to stick to minute impurities on the surface of the photoresist, or is apt to stick to or be polymerized on the surface of the photoresist due to diffusion, with the consequence that there are formed projections during the etching process. As the insulation layer is etched under such a condition, the projections of the photoresist are transferred to the insulation layer since the photoresist and the insulation layer are etched at the same rate. Therefore, the insulation layer to be smoothed out also has many projections (indicated at 100A, 100B in FIG. 5 of the accompanying drawings) formed on its surface. The magnetic layer of Sendust or an amorphous material sputtered or evaporated on the insulation layer has corresponding projections, and the recording and reproducing efficiency of the produced thin-film magnetic head is low.

Another problem is that the surface irregularities of the photoresist vary dependent on the pattern size (pattern width and pattern-to-pattern distance) of the coil conductor layer(s). FIG. 6 of the accompanying drawings illustrates how the height a of surface irregularities of the photoresist coated on the insulation layer to a thickness of about 8 micrometers varies with the pattern width W and the pattern-to-pattern distance W on the insulation layer, the surface irregularities of the insulation layer having a height of 2 micrometers. As is apparent from FIG. 6, as the pattern size becomes larger, the flatness of the photoresist is reduced, and an appreciable amount of surface irregularities remains on the surface of the etched insulation layer.

SUMMARY OF THE INVENTION

It is an object of the present invention to provide a method of smoothing out surface irregularities of an electronic device by using an ion etching process.

Another object of the present invention is to provide a method of smoothing out an irregular surface of an electronic device irrespective of the pattern size on the irregular surface.

According to an embodiment of the present invention, an organic resin layer, i.e. a photoresist, is coated on an irregular surface of $SiO_2$, for example, and is heated to at least 130° C., and then etched by an ion beam applied at a first angle of ion bombardment which is smaller than an angle of ion bombardment at which the organic resin layer can be etched at a maximum etching rate. Thereafter the organic resin layer and the irregular surface are etched at a second angle of ion bombardment at which the organic resin layer and the irregular surface are etched at the same rate.

According to another embodiment of the present invention, an insulation layer of $SiO_2$, for example, having surface irregularities to be smoothed out is deposited on an irregular surface, and coated with a lower photoresist having a thickness substantially equal to the height of the surface irregularities. The lower photoresist is patterned to provide a dummy resist filling recesses of the surface irregularities. The dummy resist is then heated to at least 200° C. An upper photoresist is coated on the insulation layer and the dummy resist, and heated to at least 130° C. The upper photoresist is etched by an ion beam applied at a first angle of ion bombardment which is smaller than an angle of ion bombardment at which the upper photoresist can be etched at a maximum etching rate. Thereafter, the upper photoresist and the insulation layer are etched at a second angle of ion bombardment at which the upper photoresist and the insulation layer are etched at the same rate.

The first angle of ion bombardment is larger than 30° and smaller than 45°, and the second angle of ion bombardment is 75°.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Figure 1A:
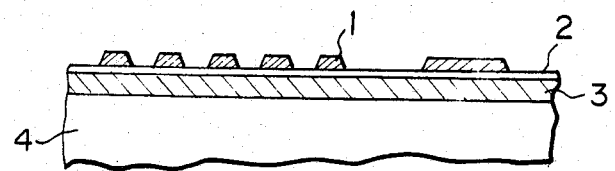
FIGS. 1(a) through 1(e) are fragmentary cross-sectional views showing a process of fabricating a thin-film magnetic head according to an embodiment of the present invention.
Figure 1B:
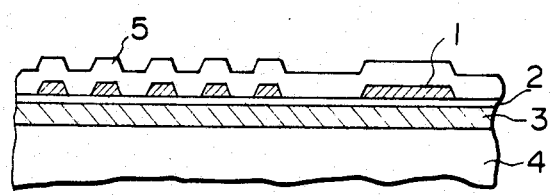
Figure 1C:
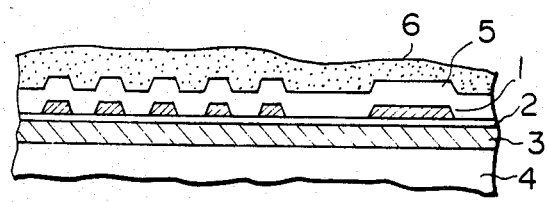

FIGS. 1(a) through 1(e) illustrate successive steps of fabricating a thin-film magnetic head according to an embodiment of the present invention. As shown in FIG. 1(a), a magnetic material such as Sendust or an amorphous material is deposited by sputtering or evaporation as a lower magnetic layer 3 on a substrate 4, and then a first insulation layer 2 as of $SiO_2$ is deposited on the lower magnetic layer 3. Thereafter, a conductive layer of Cu or Al, for example, is deposited on the first insulation layer 2 and etched into a coil conductor 1 as by ion etching. As illustrated in FIG. 1(b), a second insulation layer 5 of $SiO_2$ or the like is sputtered or evaporated over the coil conductor 1, the second insulation layer 5 having surface irregularities or projections according to the pattern of the coil conductor 1. The second insulation layer 5 is thereafter coated with a photoresist 6 (FIG. 1(c)) of an organic resin having a thickness, about 8 micrometers, sufficiently larger than the heights of irregularities of the second insulation layer 5. The photoresist 6 is then heated to 130° C. or a higher temperature. If the temperature to which the photoresist 6 is heated were below 130° C., the photoresist 6 would not be completely thermally decomposed and would contain rapidly and slowly etched areas when subsequently etched by an ion beam. The photoresist 6 would then have projections and recesses formed in such etching process, which would be transferred to the second insulation layer 5, with the result that the second insulation layer 5 would not be made flat.

Figure 1D:
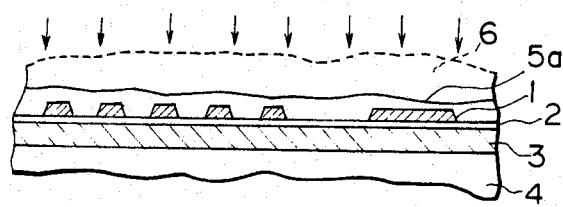
Figure 2:
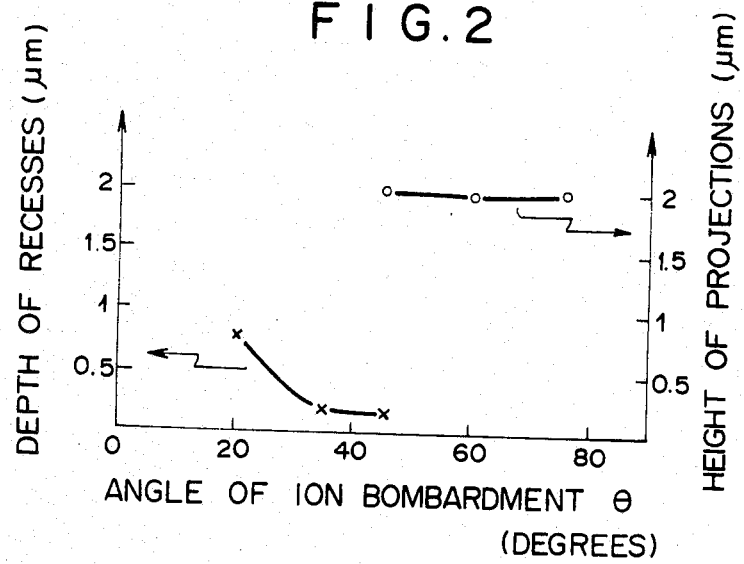
FIG. 2 is a graph showing the relationship between angles of ion bombardment, and depths of recesses and heights of projections.
Figure 3:
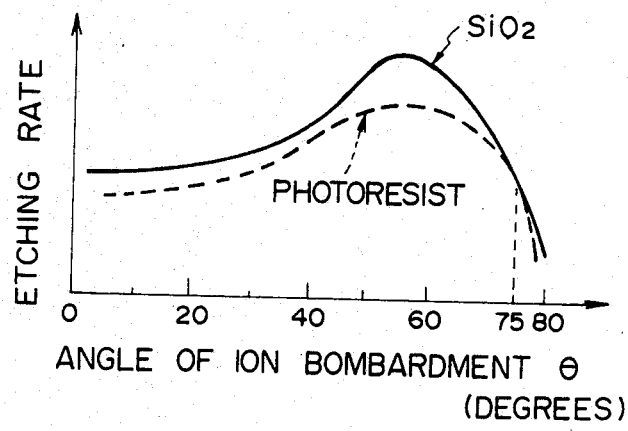
FIG. 3 is a graph illustrating how the etching rates of an insulation layer of $SiO_2$ and a photoresist depend on the angle of ion bombardment.

As shown in FIG. 1(d), the photoresist 6 and the second insulation layer 5 are etched by an ion beam applied thereto at a selected angle of ion bombardment which is formed between the ion beam and a line normal to the surface being etched. More specifically, if the angle of ion bombardment $\theta$ were comparatively small as indicated on the lefthand side in FIG. 2, e.g., if the angle of ion bombardment were 20° C., the photoresist 6 would be formed with conical recesses each having a depth of about 0.8 micrometer and a diameter of about 10 micrometers. As the angle of ion bombardment would be progressively larger, the depth of the conical recesses would be reduced. The depth of the conical recesses would be about 0.2 micrometer if the angle of ion bombardment were 35°. The photoresist 6 would have conical recesses and projections at 45°, and would have mostly conical projections each having a height of about 2 micrometers and a diameter of 10 micrometers at more than 45° as shown in FIG. 3. These conical projections would be produced only when the photoresist would be etched for a long period of time, but almost no conical projections would be formed when the etching time would be several tens of minutes. In view of the above observations, according to the present invention, the photoresist 6 is first etched, in its most part, for several hours at an angle of ion bombardment greater than 30° and smaller than 45°, so that the photoresist 6 will be formed with recesses having a depth of about at most 1 micrometer which do not substantially affect the magnetic properties of the resulting thin-film magnetic head. Then, the photoresist 6 and the second insulation layer 5 are etched for several tens of minutes at an angle of ion bombardment of 75° such that the photoresist 6 and the second insulation layer 5 will be etched at the same rate, as shown in FIG. 3. As a result, the second insulation layer 5 is partly etched away, leaving a relatively flat insulation layer 5a (FIG. 1(d)). FIG. 3 shows that the angle range of from 30° to 40° is smaller than an angle of ion bombardment (about 55°) at which the photoresist 6 can be etched at a maximum etching rate.

Figure 1E:
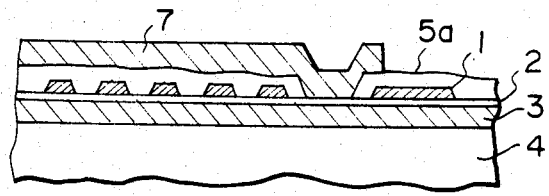

Finally, as shown in FIG. 1(e), a magnetic layer 7 such as of Sendust or an amorphous material is deposited by sputtering or evaporation on the insulation layer 5a. Since the insulation layer 5a is substantially free of projections and recesses, the magnetic layer 7 deposited thereon is also free of surface irregularities and hence its magnetic properties is not subject to deterioration which would otherwise be caused by such surface irregularities. Therefore, the resulting thin-film magnetic head has an improved recording and reproducing efficiency.

Figure 4A:
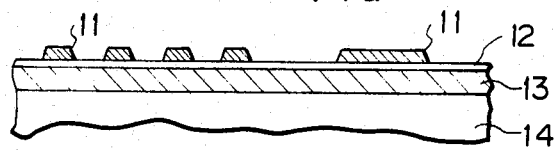
FIGS. 4(a) through 4(f) are fragmentary cross-sectional views showing a process of fabricating a thin-film magnetic head according to another embodiment of the present invention.
Figure 4B:
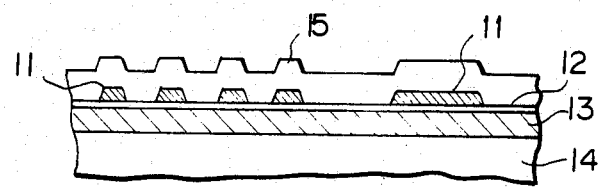
Figure 4C:
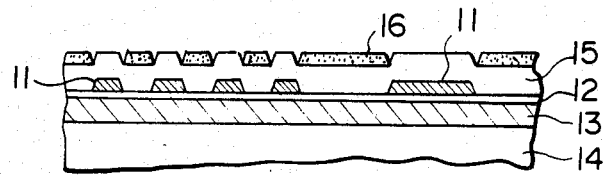
Figure 4D:
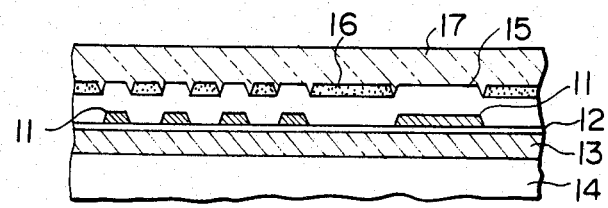

FIGS. 4(a) through 4(f) show a process of fabricating a thin-film magnetic head according to another embodiment of the present invention. As illustrated in FIG. 4(a), a lower magnetic layer 13 of Sendust or an amorphous material is deposited by sputtering or evaporation on a substrate 14, followed by the sputtering or evaporating of a conductor layer of Cu or Al on the lower magnetic layer 13. The conductor layer is ion-etched into a coil conductor 11. Then, an insulation layer 15 of $SiO_2$ or the like is deposited by sputtering or evaporation over the coil conductor 11, the insulation layer 15 having surface irregularities that are in accordance with the pattern of the coil conductor 11, as shown in FIG. 4(b). A lower photoresist 16 is coated on the insulation layer 15 to a thickness equal to the height of the projections on the surface of the insulation layer 15, and is then patterned so as to fill only the recesses of the insulation layer 15, as shown in FIG. 4(c). The lower photoresist 16, now serving as a dummy resist, is heated to a temperature of 200° C. or higher for the reason described below. An upper photoresist 17 is coated on the insulation layer 15 and the dummy resist 16 so that the gaps formed between the insulation layer 15 and the dummy resist 16 can be filled with the photoresist 17, as shown in FIG. 4(d). If the temperature to which the photoresist 16 was heated were lower than 200° C., then the photoresists 16 and 17 would be melted and mixed together, failing to fill the recesses of the insulation layer 15, and the coated photoresist 17 would not provide a flat surface. The thickness of the upper photoresist 17 is selected to be at least 4 micrometers to make the upper photoresist 17 flat regardless of the pattern size of the coil conductor 11. The upper photoresist 17 is then heated to 130° C. or a higher temperature for the reason described above with respect to FIG. 1(c).

Figure 4E:
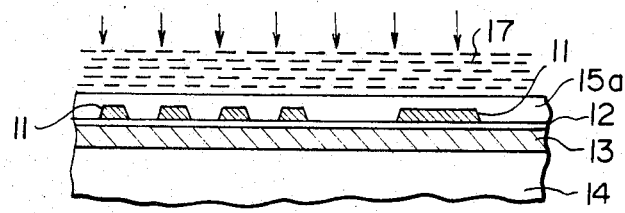

The upper photoresist 17 and the insulation layer 15 are etched for several hours by an ion beam applied at an angle of ion bombardment which is larger than 30° and smaller than 45°, and then etched for several tens of minutes at an angle of ion bombardment of 75°, thus providing a relatively flat insulation layer 15a, as shown in FIG. 4(e). These angles of ion bombardment are selected for the reasons described above with respect to FIG. 1(d). The insulation layer 15a is substantially free of unwanted projections on its surface irrespective of the pattern size of the coil conductor 11.

Figure 4F:
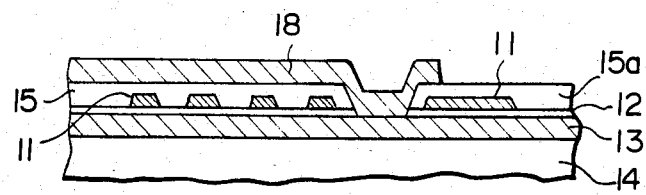
Figure 5:
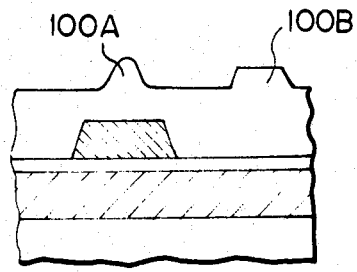
FIG. 5 is an enlarged fragmentary cross-sectional view of a conventional thin-film magnetic head.
Figure 6:
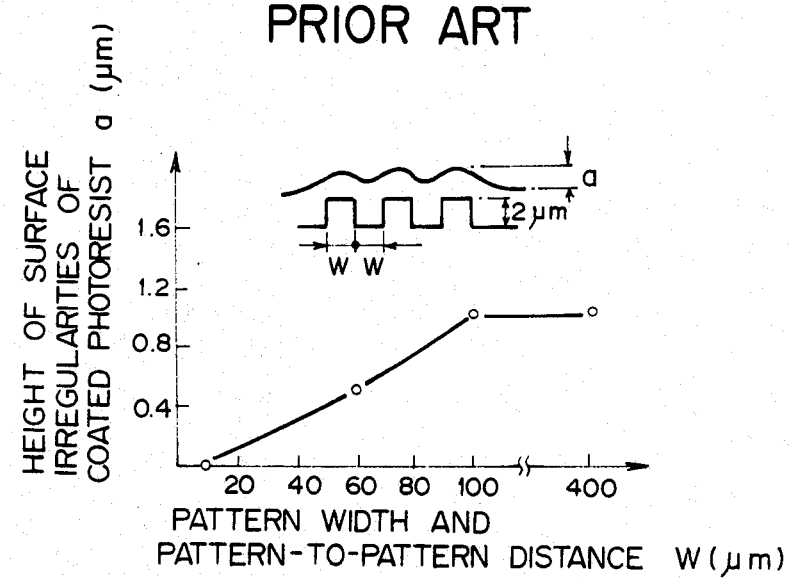
FIG. 6 is a graph showing the relationship between pattern sizes and heights of surface irregularities on a coated photoresist.

A magnetic layer 18 of Sendust or an amorphous material is finally sputtered or evaporated on the flat insulation layer 15a, as shown in FIG. 4(f). Surface irregularities on the magnetic layer 18 are limited to a height or depth of 0.5 micrometer. As a consequence, the magnetic permeability of the magnetic layer 18 is prevented from being lowered, and hence the produced magnetic head has an improved recording and reproducing efficiency.

While the present invention has been described as being applied to the fabrication of a thin-film magnetic head, the present invention is also applicable to various electronic devices such as semiconductor devices which require removal of surface irregularities.

Although certain preferred embodiments have been shown and described, it should be understood that many changes and modifications may be made therein without departing from the scope of the appended claims.

We claim:

1. A method of smoothing out an irregular surface of an electronic device, comprising the steps of:
  (i) coating an organic resin layer on the irregular surface;
  (ii) heating said organic resin layer;
  (iii) etching said organic resin layer with an ion beam applied at a first angle of ion bombardment which is smaller than an angle of ion bombardment at which said organic resin layer can be etched at a maximum etching rate; and
  (iv) thereafter etching said organic resin layer and said irregular surface at a second angle of ion bombardment at which said organic resin layer and said irregular surface are etched at the same rate.

2. A method according to claim 1, wherein said irregular surface is made of $SiO_2$ and said organic resin layer comprises a photoresist, said photoresist being heated to at least 130° C., said first angle of ion bombardment being larger than 30° and smaller than 45°, said second angle of ion bombardment being 75°.

3. A method of smoothing out an irregular layer surface of an electronic device, comprising the steps of:
  (i) depositing an insulation layer having surface irregularities to be smoothed out;
  (ii) coating said insulation layer with a lower photoresist having a thickness substantially equal to the height of said surface irregularities;
  (iii) patterning said lower photoresist to provide a dummy resist filling recesses of said surface irregularities;
  (iv) heating said dummy resist;
  (v) coating an upper photoresist on said insulation layer and said dummy resist;
  (vi) heating said upper photoresist;
  (vii) etching said upper photoresist with an ion beam applied at a first angle of ion bombardment which is smaller than an angle of ion bombardment at which said upper photoresist can be etched at a maximum etching rate; and
  (viii) thereafter etching said upper photoresist and said insulation layer at a second angle of ion bombardment at which said upper photoresist and said insulation layer are etched at the same rate.

4. A method according to claim 3, wherein said insulation layer is made of $SiO_2$, said dummy resist being heated to at least 200° C., said upper photoresist being heated to at least 130° C., said first angle of ion bombardment being larger than 30° and smaller than 45°, said second angle of ion bombardment being 75°.

* * * * *